US012166278B2

(12) United States Patent
Lin et al.

(10) Patent No.: US 12,166,278 B2
(45) Date of Patent: Dec. 10, 2024

(54) TRANSPARENT ANTENNA AND MANUFACTURING METHOD THEREOF

(71) Applicant: INDUSTRIAL TECHNOLOGY RESEARCH INSTITUTE, Hsinchu (TW)

(72) Inventors: Shih-Ming Lin, Chiayi County (TW); Wei Chung, Hsinchu County (TW); Chen-Chun Yu, Hsinchu (TW); Hsin-Chu Chen, Miaoli County (TW); Wei-Yu Li, Yilan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 656 days.

(21) Appl. No.: 17/409,714

(22) Filed: Aug. 23, 2021

(65) Prior Publication Data

US 2022/0359980 A1 Nov. 10, 2022

(30) Foreign Application Priority Data

May 7, 2021 (TW) .................................. 110116637

(51) Int. Cl.
*H01Q 1/38* (2006.01)
*H01Q 1/48* (2006.01)
(Continued)

(52) U.S. Cl.
CPC ................. *H01Q 1/38* (2013.01); *H01Q 1/48* (2013.01); *H05K 3/0011* (2013.01); *H05K 3/4038* (2013.01)

(58) Field of Classification Search
CPC ........ H01Q 1/38; H01Q 9/0407; H05K 1/115; H05K 2201/09681; H05K 3/4038; H05K 2201/09563
See application file for complete search history.

(56) References Cited

U.S. PATENT DOCUMENTS 4,864,314 A * 9/1989 Bond ....................... H01Q 5/42
343/897
10,992,051 B2 * 4/2021 Qin ...................... H01Q 1/1271
(Continued)

FOREIGN PATENT DOCUMENTS

EP 2526589 B1 11/2021
KR 101060424 B1 8/2011
(Continued)

OTHER PUBLICATIONS

TW Office Action in Application No. 110116637 Dated Nov. 7, 2022.

*Primary Examiner* — Ricardo I Magallanes
(74) *Attorney, Agent, or Firm* — Maschoff Brennan (57) ABSTRACT

A transparent antenna includes a substrate, an antenna grid layer, and a ground grid layer. The substrate has an electrically conductive hole extending from two opposite surfaced of the substrate. The antenna grid layer is formed on a surface of the substrate. The antenna grid layer includes a feeding portion and a transmission portion. The ground grid layer is formed on another surface of the substrate. The ground grid layer is coupled to the feeding portion of the antenna grid layer via the electrically conductive hole. An offset distance between a projection of a gridline of the antenna grid layer on the first surface and a projection of a gridline of the ground grid layer on the first surface is smaller than or equal to half of a difference between a line width of the antenna grid layer and a line width of the ground grid layer.

17 Claims, 11 Drawing Sheets

(51) Int. Cl.
  *H05K 3/00*    (2006.01)
  *H05K 3/40*    (2006.01)

(56) References Cited

U.S. PATENT DOCUMENTS

| | | | | |
|---|---|---|---|---|
| 11,682,833 | B2 * | 6/2023 | Wang | H01Q 9/0471 |
| | | | | 343/772 |
| 11,705,624 | B2 * | 7/2023 | Suzuki | H05K 1/0287 |
| | | | | 343/897 |
| 11,848,488 | B2 * | 12/2023 | Oh | H01Q 1/36 |
| 11,929,553 | B2 * | 3/2024 | Shammas | H01Q 15/242 |
| 11,955,697 | B2 * | 4/2024 | Lee | H01Q 1/36 |
| 2007/0040756 | A1 * | 2/2007 | Song | H01Q 13/106 |
| | | | | 343/713 |
| 2009/0051620 | A1 * | 2/2009 | Ishibashi | H01Q 9/16 |
| | | | | 343/897 |
| 2009/0140938 | A1 * | 6/2009 | Ishibashi | H01Q 1/44 |
| | | | | 343/897 |
| 2010/0127943 | A1 * | 5/2010 | Inoue | H01Q 15/14 |
| | | | | 343/837 |
| 2011/0210903 | A1 * | 9/2011 | Sarabandi | H01Q 15/0086 |
| | | | | 343/904 |
| 2012/0125677 | A1 * | 5/2012 | Choi | H05K 1/0224 |
| | | | | 174/262 |
| 2014/0106684 | A1 * | 4/2014 | Burns | H01Q 21/28 |
| | | | | 29/601 |
| 2015/0170996 | A1 * | 6/2015 | Altabella Lazzi | |
| | | | | H01L 23/49827 |
| | | | | 438/618 |
| 2015/0288052 | A1 * | 10/2015 | Liu | H01L 21/486 |
| | | | | 438/26 |
| 2016/0190678 | A1 * | 6/2016 | Hong | H01Q 1/364 |
| | | | | 343/700 MS |
| 2019/0113609 | A1 * | 4/2019 | Baheti | H01Q 9/0457 |
| 2020/0021008 | A1 * | 1/2020 | Yong | H01Q 21/005 |
| 2020/0243959 | A1 * | 7/2020 | Ryu | H01Q 9/0407 |
| 2020/0411954 | A1 * | 12/2020 | Jia | H01Q 15/0026 |
| 2020/0411993 | A1 * | 12/2020 | Jia | H01Q 9/0414 |
| 2022/0094039 | A1 * | 3/2022 | Jia | H01Q 1/38 |
| 2022/0166125 | A1 * | 5/2022 | Kaufmann | H01Q 5/28 |
| 2022/0201838 | A1 * | 6/2022 | Suzuki | H05K 1/165 |
| 2022/0255215 | A1 * | 8/2022 | Park | H01Q 1/1271 |
| 2023/0062683 | A1 * | 3/2023 | Take | H05K 3/108 |
| 2023/0063968 | A1 * | 3/2023 | Morimoto | H01Q 5/371 |
| 2023/0089629 | A1 * | 3/2023 | Ouyang | H01Q 1/243 |
| | | | | 343/720 |
| 2023/0094039 | A1 * | 3/2023 | Park | H01Q 9/0407 |
| | | | | 343/727 |
| 2023/0163443 | A1 * | 5/2023 | Chang | H01Q 1/007 |
| | | | | 343/720 |
| 2023/0223696 | A1 * | 7/2023 | Nakamura | H01Q 1/2283 |
| | | | | 343/848 |
| 2023/0352837 | A1 * | 11/2023 | Luk | H01Q 9/0457 |
| 2023/0402736 | A1 * | 12/2023 | Zhu | H01Q 1/273 |
| 2023/0402755 | A1 * | 12/2023 | Yoon | H01Q 5/35 |
| 2024/0097318 | A1 * | 3/2024 | Zhang | H01Q 1/243 |
| 2024/0113427 | A1 * | 4/2024 | Deng | H01Q 3/267 |

FOREIGN PATENT DOCUMENTS

| | | | | |
|---|---|---|---|---|
| TW | | I382590 B | 1/2013 | |
| TW | | 201642520 A | 12/2016 | |
| TW | | 201719352 A | 6/2017 | |
| WO | WO-2006106759 | A1 * | 10/2006 | ........... H01Q 1/1271 |
| WO | WO-2011089219 | A1 * | 7/2011 | ........... H01Q 1/1278 |
| WO | WO-2017069217 | A1 * | 4/2017 | ............. B32B 15/08 |

\* cited by examiner

TRANSPARENT ANTENNA AND MANUFACTURING METHOD THEREOF

CROSS-REFERENCE TO RELATED APPLICATIONS

This non-provisional application claims priority under 35 U.S.C. § 119(a) on Patent Application No(s). 110116637 filed in Taiwan, R.O.C. on May 7, 2021, the entire contents of which are hereby incorporated by reference.

TECHNICAL FIELD

The disclosure relates to an antenna and a manufacturing method thereof, more particularly to a transparent antenna and a manufacturing method thereof.

BACKGROUND

As mobile communication progresses, the mobile communication is widely applied in mobile devices (e.g., smart phones, tablet computers, and notebook computers) and transportations (e.g., motorcycles, vehicles, and airplanes). Since tempered glass has been adopted to replace the metal to serve as the material of the outer casing of mobile devices, and the transportations usually have transparent glass windows, how to arrange an antenna on transparent glass is one of the issues in this field.

SUMMARY OF THE INVENTION

One embodiment of the disclosure provides a transparent antenna. The transparent antenna includes a substrate, an antenna grid layer, and a ground grid layer. The substrate has a first surface, a second surface, and at least one electrically conductive hole. The second surface is opposite to the first surface, and the at least one electrically conductive hole extends from the first surface to the second surface. The antenna grid layer is formed on the first surface of the substrate. The antenna grid layer includes a feeding portion and a transmission portion. The ground grid layer is formed on the second surface of the substrate. The ground grid layer is coupled to the feeding portion of the antenna grid layer via the at least one electrically conductive hole. An offset distance between a projection of a gridline of the antenna grid layer on the first surface and a projection of a gridline of the ground grid layer on the first surface is smaller than or equal to half of a difference between a line width of the antenna grid layer and a line width of the ground grid layer.

Another embodiment of the disclosure provides a manufacturing method of the transparent antenna. The manufacturing method includes forming a through hole on a substrate, wherein the through hole penetrates through two opposite surfaces of the substrate, forming an electrically conductive portion in the through hole, wherein the through hole and the electrically conductive portion together form an electrically conductive hole, determining a line width of an antenna grid layer to be a first width and determining a line width of a ground grid layer to be a second width according to an accuracy of an alignment process that is performed to align the antenna grid layer with the ground grid layer, and forming the antenna grid layer having the line width being the first width and the ground grid layer having the line width being the second width on the two opposite surfaces of the substrate.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
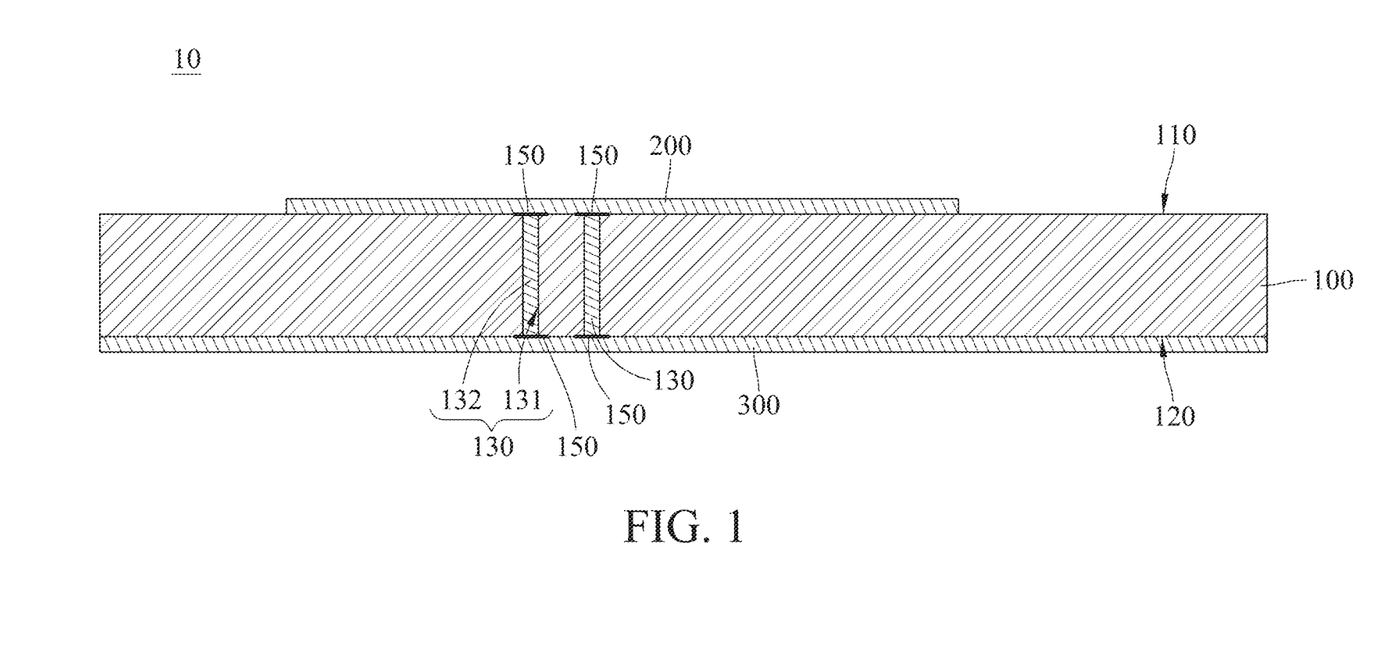
FIG. 1 is a cross-sectional view of a transparent antenna according to a first embodiment of the disclosure.

Referring to FIG. 1, there is shown a cross-sectional view of a transparent antenna 10 according to a first embodiment of the disclosure.

In this embodiment, the transparent antenna 10 includes a substrate 100, an antenna grid layer 200, and a ground grid layer 300. The substrate 100 has a first surface 110, a second surface 120, and a plurality of electrically conductive holes 130. The second surface 120 is opposite to the first surface 110. The electrically conductive holes 130 extends from the first surface 110 to the second surface 120. One of the electrically conductive holes 130 includes a through hole 131 and an electrically conductive portion 132. The through hole 131 extends from the first surface 110 to the second surface 120, and the electrically conductive portion 132 is filled in the through hole 131 and extends from the first surface 110 to the second surface 120. The antenna grid layer 200 is stacked on the first surface 110 of the substrate 100. The ground grid layer 300 is stacked on the second surface 120 of the substrate 100. The ground grid layer 300 is electrically connected to the antenna grid layer 200 via the electrically conductive holes 130.

Figure 2:
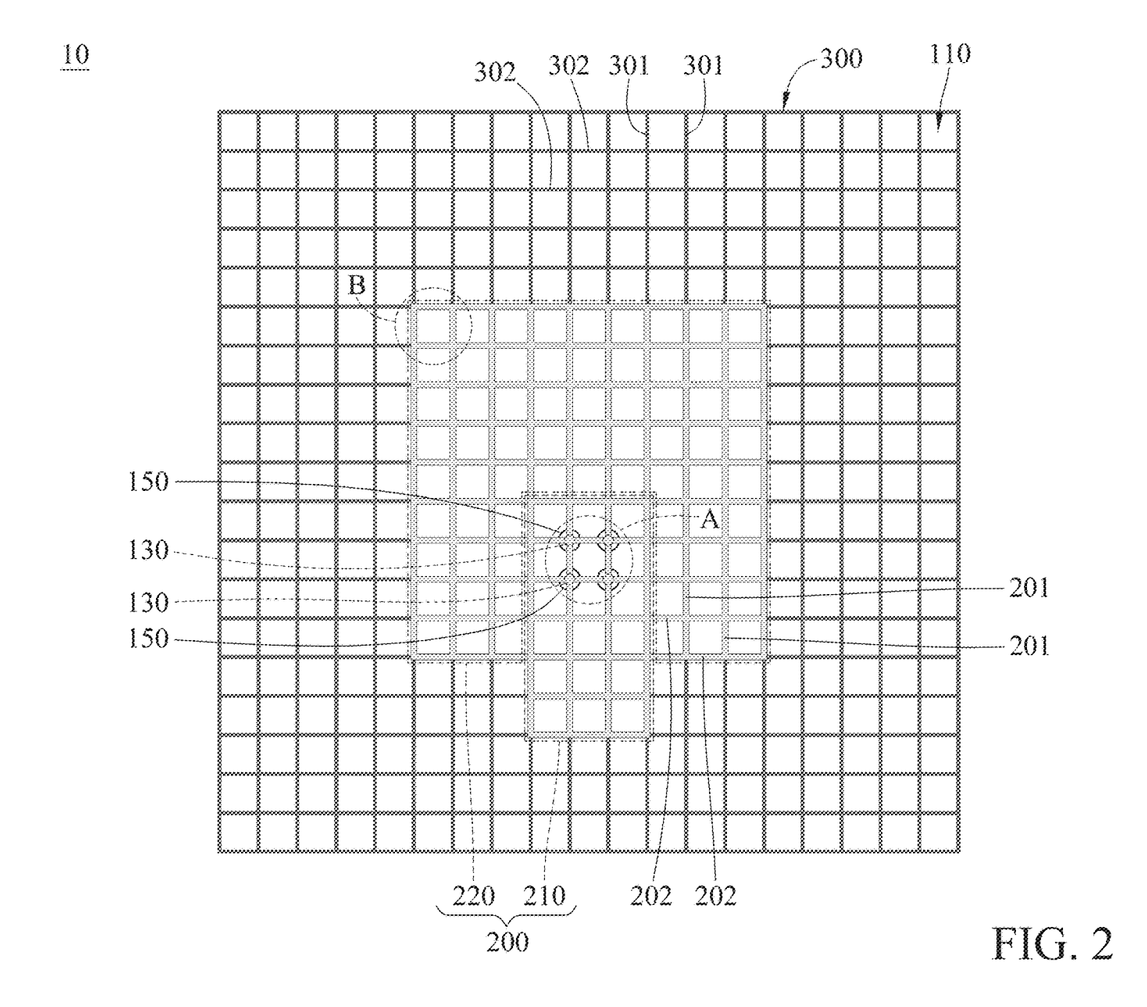
FIG. 2 is a top view of the transparent antenna in FIG. 1.
Figure 3:
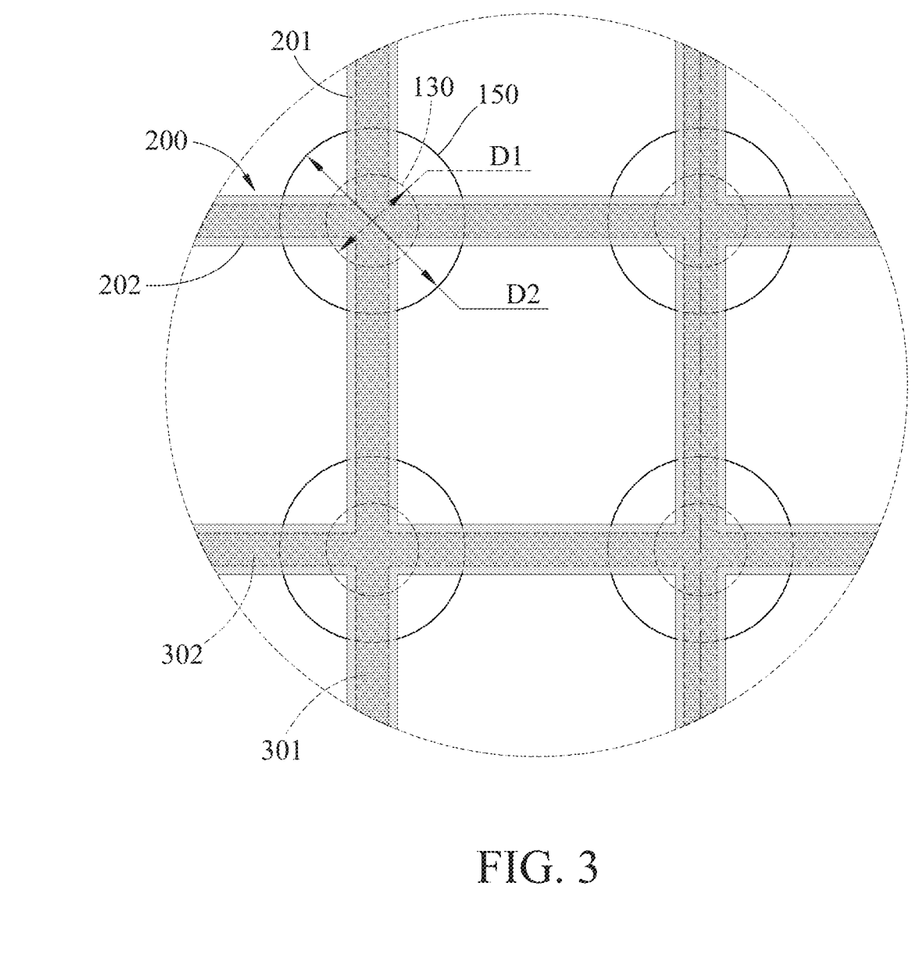
FIG. 3 is a partial enlarged view of an area A of the transparent antenna in FIG. 2.

Referring to FIGS. 2 and 3, there are shown a top view of the transparent antenna 10 in FIG. 1 and a partial enlarged view of an area A of the transparent antenna 10 in FIG. 2.

The antenna grid layer 200 includes a feeding portion 210 and a transmission portion 220. The feeding portion 210 is configured to feed an electromagnetic wave signal. The transmission portion 220 is connected to the feeding portion 210. The transmission portion 220 is configured to receive and transmit the electromagnetic wave signal. The antenna grid layer 200, for example, includes a plurality of vertical electrically conductive portions 201 and a plurality of transversal electrically conductive portions 202. The vertical electrically conductive portions 201 and the transversal electrically conductive portions 202 are, for example, perpendicular to each other and intersect so as to form a grid pattern.

The ground grid layer 300, for example, includes a plurality of vertical electrically conductive portions 301 and a plurality of transversal electrically conductive portions 302. The vertical electrically conductive portions 301 and the transversal electrically conductive portions 302 are, for example, perpendicular to each other and intersect so as to from a grid pattern. In this embodiment, the size of the ground grid layer 300 is, for example, not greater than 1.8 times of the size of the antenna grid layer 200, such that the return loss of the transparent antenna 10 can be reduced, and the radiation characteristic of the transparent antenna 10 can be enhanced.

The ground grid layer 300 is coupled with the feeding portion 210 of the antenna grid layer 200 via the electrically conductive holes 130. Specifically, two opposite sides of one electrically conductive hole 130 are respectively in electrical contact with some of grid points of the feeding portion 210 of the antenna grid layer 200 and some of grid points of the ground grid layer 300 via an electrically conductive pad 150, such that the ground grid layer 300 is coupled with the feeding portion 210 of the antenna grid layer 200 via the electrically conductive holes 130. The ground grid layer 300 is configured to adjust the impedance matching.

The electrically conductive portion 132 of the electrically conductive hole 130 is, for example, made of metal, and the metal is poor in light permeability. Therefore, the light permeability of the transparent antenna 10 can be improved by reducing the diameters of each of the electrically conductive holes 130. In this embodiment, each of the electrically conductive holes 130 is only in electrical contact with a single grid point of the feeding portion 210 of the antenna grid layer 200, and each of the electrically conductive holes 130 is only in electrical contact with a single grid point of ground grid layer 300, such that the diameter of each electrically conductive hole 130 can be reduced. On the contrary, in a configuration of single one electrically conductive hole with large diameter and single one electrically conductive pad with large diameter, the electrically conductive hole and the electrically conductive pad are simultaneously in electrical contact with many grid points of the antenna grid layer 200 and many grid points of the ground grid layer 300. Therefore, the electrically conductive hole and the electrically conductive pad cover a larger region than that covered by the electrically conductive holes 130 and the electrically conductive pads 150. Accordingly, compared to such configuration, the transparent antenna 10 of this embodiment have a better light permeability. In addition, the diameter of the electrically conductive pads 150 can also be reduced due to the reduction of the diameter of each of the electrically conductive holes 130, such that the light permeability of the transparent antenna 10 can be further improved.

In addition, when the substrate is a thin glass substrate, the difficulty of the through-hole forming process is in direct proportion to the required size of the through hole. Specifically, the thin glass substrate has a relatively weak structural strength, such that the thin glass substrate may be easily broken during forming larger through hole. Therefore, the electrically conductive holes 130 with small diameters can reduce the difficulty of the through-hole forming process on the thin glass substrate while implementing the signal transmission and the requirement of the light permeability of the transparent antenna 10.

In this embodiment, the diameter D2 of the electrically conductive pad 150 is, for example, two times greater than the diameter D1 of the electrically conductive hole 130, but the present disclosure is not limited thereto; in some other embodiments, the diameter of the electrically conductive pad may be larger than or equal to the diameter of the electrically conductive hole. In addition, the relationship between the quantity of the electrically conductive holes 130 and the diameter D1 of the electrically conductive hole 130 is determined according to the required cross-sectional area for electrical conduction, which is represented as $N=4a/\pi D1^2$, where the required cross-sectional area is denoted as "a", and the quantity of the electrically conductive hole 130 is denoted as "N". It will be introduced in detail in the following paragraphs.

In addition, if the single one electrically conductive hole with larger diameter is replaced with four of the electrically conductive holes 130 with small diameters, the light permeability can be increased from 39% to 44.1%, the input return loss can be reduced from −10 dB to −20 dB, and the gain value can be increased from 3.85 dBi to 4.3 dBi. The reason will be described hereinafter.

In order to achieve the same electrical property of vertical transmission as the single one electrically conductive hole with larger diameter, the diameter of the electrically conductive holes 130 in the array arrangement is required to be obtained from $D1=D^2/N$, and $D2=D1\times2$, where the diameter of the electrically conductive holes 130 is denoted as D1, the diameter of the single one electrically conductive hole with large diameter is denoted as D, the quantity of the electrically conductive holes 130 is denoted as N, and the diameter of the electrically conductive pads 150 is denoted as D2. When the electrically conductive pad 150 is in a square shape, the side length of the electrically conductive pad 150 is two times of the diameter of the electrically conductive hole 130. When the electrically conductive pad 150 is in a circular shape, the diameter of the electrically conductive pad 150 is two times of the diameter of the electrically conductive hole 130. In addition, the quantity of the electrically conductive holes 130 is determined by the quality of the drilling process. Assuming that the diameter D1 of the electrically conductive hole 130 may be one fifth to the thickness of the substrate 100 in minimum (i.e., the ratio of depth to width is equal to 5), the quantity of the electrically conductive holes 130 may be determined according to the diameter D1 of the electrically conductive hole 130.

In this embodiment, the through hole 131 is entirely filled with the electrically conductive portion 132, but the present disclosure is not limited thereto; in some other embodiments, the through hole can be partially filled with the electrically conductive portion. For example, the electrically conductive portion may be only formed on the inner surface of the through hole.

Figure 4:
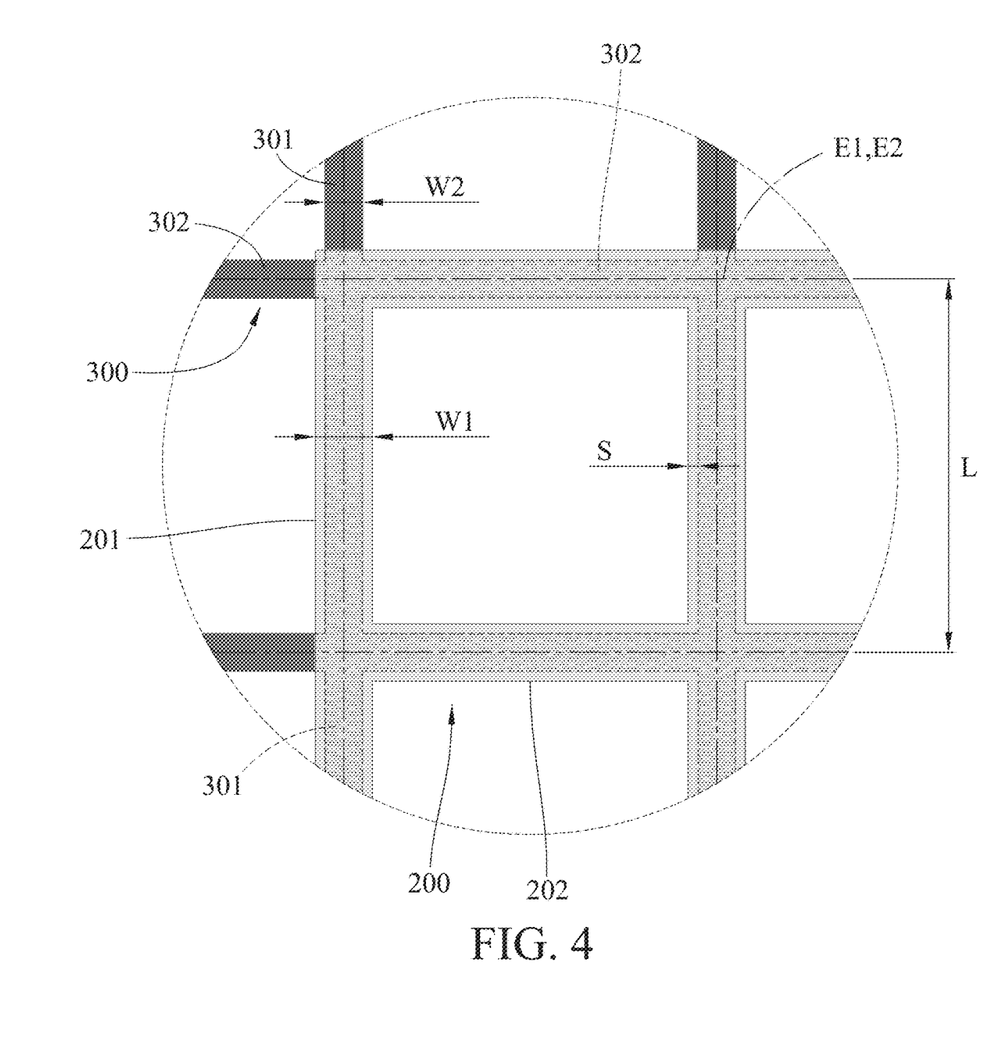
FIG. 4 is a partial enlarged view of an area B of the transparent antenna in FIG. 2.

Referring to FIGS. 2 and 4. FIG. 2 is a top view of the transparent antenna in FIG. 1, and FIG. 4 is a partial enlarged view of an area B of the transparent antenna in FIG. 2.

The vertical electrically conductive portions 201 and the transversal electrically conductive portions 202 of the antenna grid layer 200 have the same width W1. The vertical electrically conductive portions 201 and the transversal electrically conductive portions 202 of the antenna grid layer 200 are, for example, perpendicular to each other so as to form a square grid pattern. The antenna grid layer 200 has a gridline E1. The gridline E1 is composed of central lines of the vertical electrically conductive portions 201 and central lines of the transversal electrically conductive portions 202.

The vertical electrically conductive portions 301 and the transversal electrically conductive portions 302 of the ground grid layer 300 have the same width W2. The vertical electrically conductive portions 301 and the transversal electrically conductive portions 302 of the ground grid layer 300 are, for example, perpendicular to each other so as to form a square grid pattern. The ground grid layer 300 has a gridline E2. The gridline E2 is composed of central lines of the vertical electrically conductive portions 301 and central lines of the transversal electrically conductive portions 302. In this embodiment, a cell size of the ground grid layer 300 is equal to a cell size of the antenna grid layer 200; that is, a cell of the gridline E1 and a cell of the gridline E2 has the same side length L.

In this embodiment, the grid pattern of the ground grid layer 300 has a line width which is the width W2 of the vertical electrically conductive portions 301, and the grid pattern of the antenna grid layer 200 has a line width which is the width W1 of the vertical electrically conductive portions 201. A projection of the gridline E2 of the ground grid layer 300 on the first surface 110 and a projection of the gridline E1 of the antenna grid layer 200 on the first surface 110 overlap with each other, and the line width W2 of the grid pattern of the ground grid layer 300 is smaller than the line width W1 of the grid pattern of the antenna grid layer 200, such that the gridline E2 of the ground grid layer 300 is aligned with the gridline E1 of the antenna grid layer 200, and the overall light permeability of the antenna grid layer 200 and the ground grid layer 300 is maximized.

Specifically, the solid portion (i.e., the vertical electrically conductive portions 201 and the transversal electrically conductive portions 202) of the antenna grid layer 200 is not light permeable, and the hollow portion (i.e., the spaces surrounded by the vertical electrically conductive portions 201 and the transversal electrically conductive portions 202) of the antenna grid layer 200 allows light to pass through. Therefore, the light permeability of the antenna grid layer 200 can be served as an aperture ratio of the antenna grid layer 200, and the aperture ratio of the antenna grid layer 200 can be obtained from $((L-W1)/L)^2$, where the side length of the cell is denoted as L, the line width of the grid pattern of the antenna grid layer 200 is denoted as W1. For example, when the side length L of the cell is 367 μm and the line width W1 of the grid pattern of the antenna grid layer 200 is 60 μm the aperture ratio of the antenna grid layer 200 is approximately 70%.

Similarly, the solid portion (i.e., the vertical electrically conductive portions 301 and the transversal electrically conductive portions 302) of the ground grid layer 300 is not light permeable, and the hollow portion (i.e., the spaces surrounded by the vertical electrically conductive portions 301 and the transversal electrically conductive portions 302) of the ground grid layer 300 allows light to pass through. Therefore, the light permeability of ground grid layer 300 can be served as an aperture ratio of the ground grid layer 300, and the aperture ratio of the ground grid layer 300 can be obtained from $((L-W1)/L)^2$, where the side length of the cell is denoted as L, the line width of the grid pattern of the ground grid layer 300 is denoted as W2. For example, when the side length L of the cell is 367 and the line width W2 of the grid pattern of the ground grid layer 300 is 30 μm the aperture ratio of the ground grid layer 300 is approximately 84.3%.

When the antenna grid layer 200 is not aligned with the ground grid layer 300 (that is, the projection of the antenna grid layer 200 on the first surface 110 and the projection of the ground grid layer 300 on the first surface 110 hardly overlap with each other), the overall light permeability of the antenna grid layer 200 and the ground grid layer 300 is equal to the light permeability of the antenna grid layer 200 times the light permeability of the ground grid layer 300, approximately 59%. On the contrary, in this embodiment, the gridline E2 of the ground grid layer 300 is aligned with the gridline E1 of the antenna grid layer 200, such that the overall light permeability of the antenna grid layer 200 and the ground grid layer 300 is equal to the smaller one between the light permeability of the antenna grid layer 200 and the light permeability of the ground grid layer 300 rather than the light permeability of the antenna grid layer 200 times the light permeability of the ground grid layer 300. Therefore, since the gridline E2 of the ground grid layer 300 is aligned with the gridline E1 of the antenna grid layer 200, the overall light permeability of the antenna grid layer 200 and the ground grid layer 300 can be increased from 59% to 70%.

The aforementioned overall permeability of the antenna grid layer 200 and the ground grid layer 300 is not limited to be obtained from the already known side length L of the cell and the line width W1 of the grid pattern of the antenna grid layer 200. In another aspect, the designed value of the side length L of the cell may be obtained from the already known line width W1 of the grid pattern of the antenna grid layer 200 and the desired overall light permeability of the antenna grid layer 200 and the ground grid layer 300. For example, when the overall light permeability of the antenna grid layer 200 and the ground grid layer 300 is required to be larger than 70% in the vehicle application, the designed value of the side length L of the cell can be obtained via the line width W1 of the grid pattern of the antenna grid layer 200 and the desired overall light permeability of the antenna grid layer 200 and the ground grid layer 300. In addition, when the transparent antenna 10 is applied in millimeter wave, the designed value of the side length L of the cell may be, for example, in a range from 250 μm to 2500 μm, but the present disclosure is not limited thereto.

In this embodiment, the projection of the gridline E1 of the antenna grid layer 200 on the first surface 110 and the projection of the gridline E2 of the ground grid layer 300 on the first surface 110 entirely overlap with other; that is, the offset distance between the projection of the gridline E1 of the antenna grid layer 200 on the first surface 110 and the projection of the gridline E2 of the ground grid layer 300 on the first surface 110 is equal to 0, but the present is not limited thereto. In some other embodiments, the offset distance between the projection of the gridline E1 of the antenna grid layer 200 on the first surface 110 and the projection of the gridline E2 of the ground grid layer 300 on the first surface 110 may be smaller than or equal to half (denoted as S) of the difference (W1−W2) between the line widths of the antenna grid layer 200 and the ground grid layer 300. In other words, the width S is the tolerated offset distance between the projection of the gridline E1 of the antenna grid layer 200 on the first surface 110 and the projection of the gridline E2 of the ground grid layer 300 on the first surface 110. That is, the gridline E2 of the ground grid layer 300 is not limited to entirely overlapping with the gridline E1 of the antenna grid layer 200, and it will be described hereinafter.

In another aspect, the tolerated offset distance between the projections of gridlines E1 and E2 on the first surface 110 can be obtained from the accuracy of the alignment process that is performed to align the antenna grid layer 200 with the ground grid layer 300, and the design values of the line widths W1 and W2 of the grid patterns of the antenna grid layer 200 and the ground grid layer 300 can be obtained from the tolerated offset distance between the projections of gridlines E1 and E2 on the first surface 110.

Then, assuming the designed value of the line width W1 of the grid pattern of the antenna grid layer 200 is 0.06 mm, the required cross-sectional area for electrical conduction "a" is 0.00785 mm$^2$, and the diameter of the single one electrically conductive hole with large diameter is 0.1 mm, since the designed value of the line width W1 of the grid pattern of the antenna grid layer 200 is 0.06 mm, the diameter of the electrically conductive holes 130 may be 0.06 mm, and the quantity of the electrically conductive holes 130 can be obtained according to the equation $N=4*0.00785/\pi(0.06)^2=2.77$. That is, the quantity of the electrically conductive holes 130 is at least three to satisfy the required cross-sectional for electrical conduction. In order to prevent the noise caused by the asymmetrical arrangement of the electrically conductive holes 130, four electrically conductive holes 130 in 2×2 array arrangement may be chosen to achieve the same electrical property as that of the single one electrically conductive hole with large diameter.

In addition, the signal is only transmitted via some electrically conductive holes 130 which is located at the periphery among all of the electrically conductive holes 130. As such, the electrically conductive holes 130 should be arranged in an array arrangement of 3×4, 2×2, or 2×3 instead of 3×3 and the like to reduce the number of ineffective electrically conductive holes surrounded by other electrically conductive holes in the array. When the electrically conductive holes are in an array arrangement of 3×3, there is one electrically conductive hole surrounded by the others, causing such electrically conductive holes ineffective in the signal transmission. Therefore, the electrically conductive holes 130 in an array arrangement of 3×4, 2×2, or 2×3 can reduce the quantity of the ineffective electrically conductive holes 130.

Moreover, compared to the single one electrically conductive hole with large diameter, the reduction of the diameter of the four electrically conductive holes 130 of this embodiment can reduce the diameter of the electrically conductive pads 150 while increasing the overall cross-sectional area of the electrically conductive holes 130 for signal transmission, such that the impedance of vertical transmission is reduced, thereby reducing the return loss (e.g., from −10 dB to −20 dB). Furthermore, in practical, when the electrically conductive pads 150 has the same cross-sectional area for electrical conduction, the return loss generally does not have obvious change, but such condition is not absolute and should depend on each case.

Note that the quantity of the electrically conductive holes 130 and the form of the array of the electrically conductive holes 130 are not limited in the disclosure. In some other embodiments, there may be nine electrically conductive holes 130, and they are arranged in a 3×3 array arrangement. In another embodiment, the quantity of the electrically conductive holes may be not less than 2 and not more than 12. In still another embodiment, the quantity of the electrically conductive hole may be only one.

Note that the vertical electrically conductive portions 201 and the transversal electrically conductive portions 202 of the antenna grid layer 200 are not limited to have the same width W1. In some other embodiments, the vertical electrically conductive portions of the antenna grid layer may have a width different from that of the transversal electrically conductive portions of the antenna grid layer. Similarly, the vertical electrically conductive portions of the ground grid layer may have a width different from that of the transversal electrically conductive portions of the ground grid layer.

Note that the line width W2 of the grid pattern of the ground grid layer 300 is not limited to be smaller than the line width W1 of the grid pattern of the antenna grid layer 200. In some other embodiments, the line width of the grid pattern of the ground grid layer may be larger than or equal to the line width of the grid pattern of the antenna grid layer.

Note that the cells of the gridlines E1 and E2 of the antenna grid layer 200 and the ground grid layer 300 are not limited to be in the square shape. In some other embodiments, the cells of the gridlines of the antenna grid layer and the ground grid layer may be in a triangular shape or honeycomb shape.

In this embodiment, the antenna grid layer 200 and the ground grid layer 300 are made of an electrically conductive material, such as metal, and the metal may be selected from a group consisting of gold, silver, copper, and iron.

Figure 5:
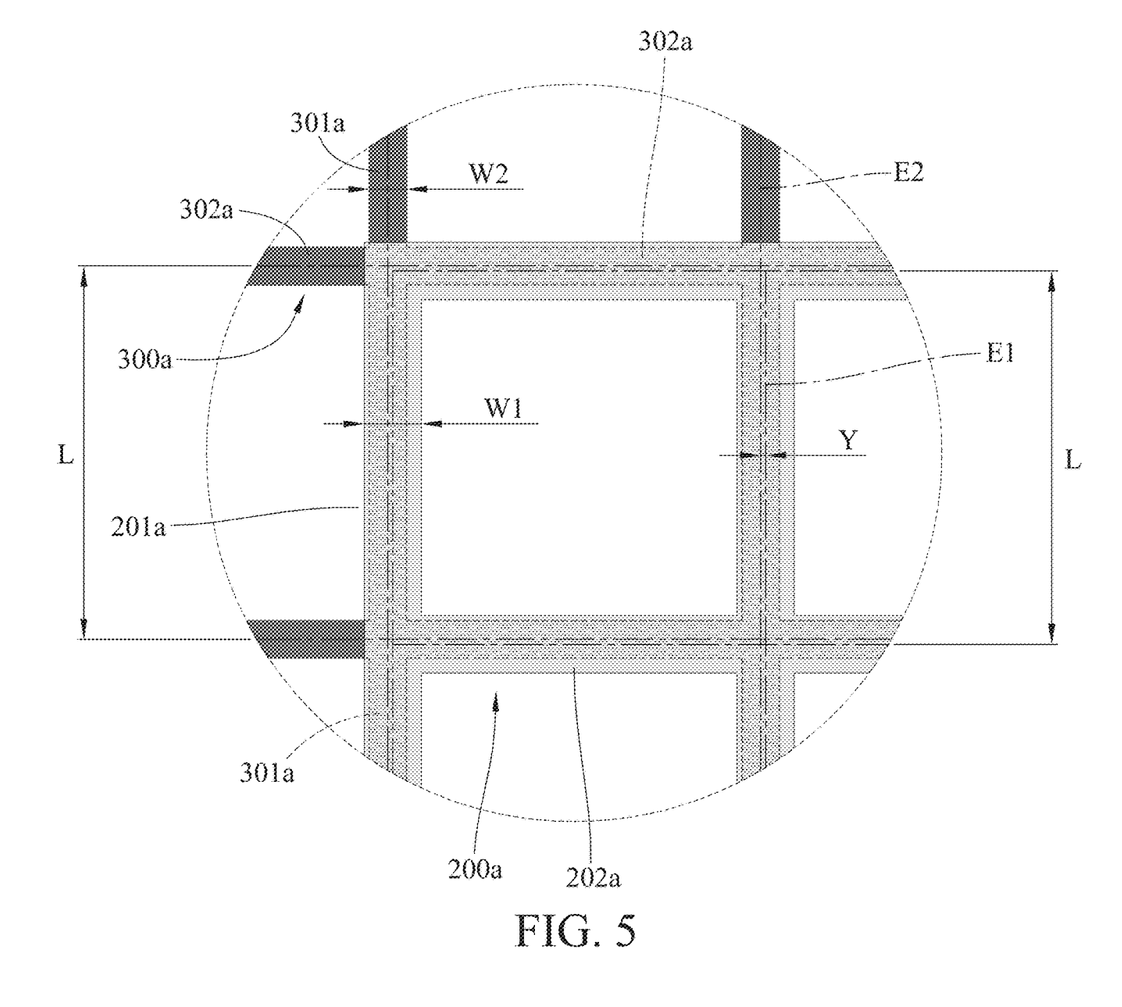
FIG. 5 is a partial top view of a transparent antenna according to a second embodiment of the disclosure.

Referring to FIG. 5, there is shown a partial top view of a transparent antenna according to a second embodiment of the disclosure. Assuming that there is an offset condition between the antenna grid layer 200a and the ground grid layer 300a, but the offset distance Y between the projections of the gridlines E1 and E2 of the antenna grid layer 200a and the ground grid layer 300a on the first surface 110 is smaller than or equal to half (denoted as S shown in FIG. 4) of the difference (W1−W2) between the width W1 of the vertical electrically conductive portion 201a (transversal electrically conductive portion 202a) of the antenna grid layer 200a and the width W2 of the vertical electrically conductive portion 301a (transversal electrically conductive portion 302a) of the ground grid layer 300. As shown, the vertical electrically conductive portions 201a and the transversal electrically conductive portions 202a of the antenna grid layer 200a still entirely overlap with the vertical electrically conductive portions 301a and the transversal electrically conductive portions 302a of the ground grid layer 300, such that the overall light permeability of the antenna grid layer 200a and the ground grid layer 300a is still approximately 70%.

On the other hand, the following will introduce this embodiment from the view of the difference of the aperture ratios of the antenna grid layer 200a and the ground grid layer 300a. As shown, when the aperture ratio of the antenna grid layer 200a is approximately 70%, and the aperture ratio of the ground grid layer 300a is approximately 84.3%, the different between them is approximately 14%. The difference between the aperture ratios represents that the line width W1 of the antenna grid layer 200a is different from the line width W2 of the ground grid layer 300a, and the difference between the line width W1 of the antenna grid layer 200a and the line width W2 of the ground grid layer 300a is proportional to the tolerated offset distance between the gridlines E1 and E2. Therefore, the larger difference between the line width W1 of the antenna grid layer 200a and the line width W2 of the ground grid layer 300a (i.e., the larger difference between the aperture ratios of the antenna grid layer 200a and the ground grid layer 300a) is, the less accuracy of the alignment process is required. In other words, the larger difference between the aperture ratios of the antenna grid layer 200a and the ground grid layer 300a, the higher chance the alignment process may success. In this embodiment, the difference between the aperture ratios of the antenna grid layer 200a and the ground grid layer 300a may be in a range between 0% and 15%.

Referring to the table below.

| | Aperture ratio (%) | | Simulation result | | |
|---|---|---|---|---|---|
| | antenna grid layer | ground grid layer | Return loss (dB) | Antenna efficiency (%) | Peak gain (dBi) |
| transparent antenna A | 70.34 | 70.34 | −13 | 82.07 | 4.85 |
| transparent antenna B | 70.34 | 80.06 | −12 | 81.5 | 4.75 |

Regarding to transparent antenna A, the aperture ratio of the antenna grid layer and the aperture ratio of the ground grid layer both are 70.34%. When the antenna grid layer and the ground grid layer are perfectly aligned with each other during the align process, the overall aperture ratio of the antenna grid layer and the ground grid layer should be 70.34%, and the performance in the return loss, the antenna efficiency, and the peak gain can be in an optimal condition. However, in practical, sometimes there may be tolerable misalignment produced in the alignment process, causing the inaccuracy of the alignment between the antenna grid layer and the ground grid layer, such that the overall aperture ratio of the antenna grid layer and the ground grid layer may be only about 60%, and the performance in the return loss, the antenna efficiency, and the peak gain may be also not quite well.

Regarding to transparent B, the aperture ratio of the antenna grid layer is 70.34%, and the aperture ratio of the ground grid layer is 80.06%. As long as the accuracy of the alignment process falls within the tolerated offset distance between the antenna grid layer and the ground grid layer, the overall aperture ratio of the antenna grid layer and the ground grid layer may easily reach to 70.34%, and the return loss, the antenna efficiency, and the peak gain of the transparent antenna B approximates to that of the transparent antenna A. As such, the light permeability and the performance of the transparent antenna can be simultaneously achieved.

The following paragraphs introduce the manufacturing method of the aforementioned transparent antenna. Referring to FIGS. 6 to 11, FIGS. 6 to 11 show the manufacturing process of the transparent antenna of FIG. 1.

Figure 6:
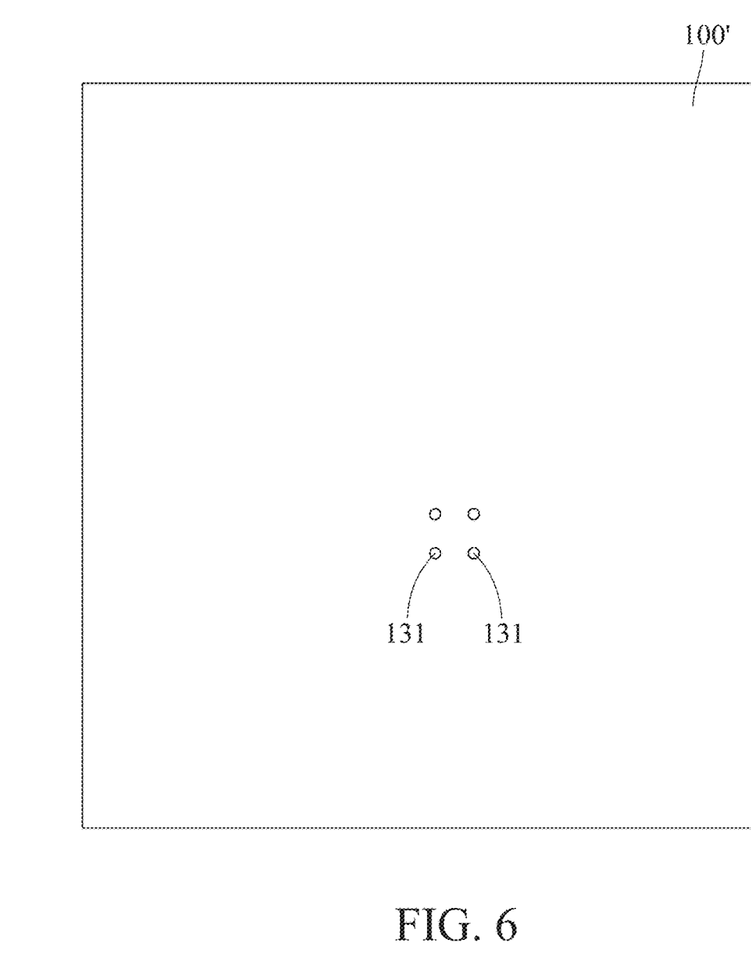
FIGS. 6 to 11 show the manufacturing process of the transparent antenna of FIG. 1.

As shown in FIG. 6, the first step is to form a plurality of through holes 131 on a substrate 100', wherein each through hole 131 penetrates through two opposite surfaces of the substrate 100'.

Figure 7:
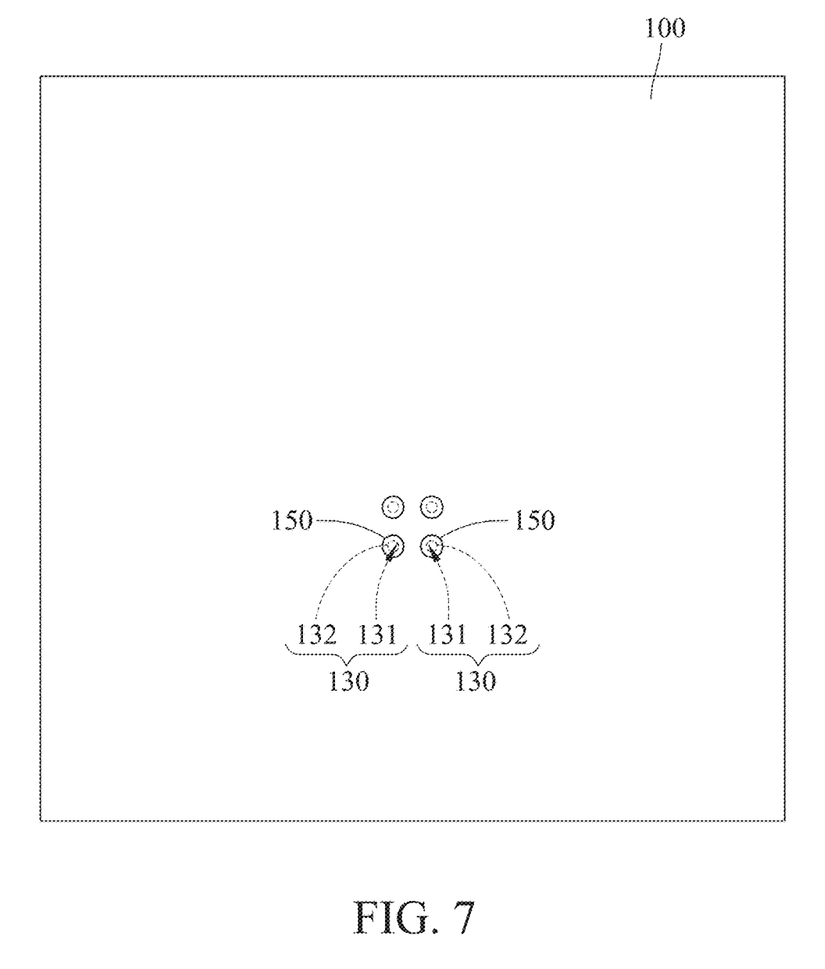

Then, as shown in FIG. 7, the following step is to form an electrically conductive portion 132 in each through hole 131, such that the through hole 131 and the electrically conductive portion 132 together form an electrically conductive hole 130.

Then, as shown in FIG. 7, the following step is to form two electrically conductive pads 150 at two opposite ends of each electrically conductive hole 130.

Then, the following step is to determine a line width of an antenna grid layer to be a first width and determine a line width of a ground grid layer to be a second width according to an accuracy of an alignment process that is performed to align the antenna grid layer with the ground grid layer. In specific, the alignment process is, for example, maskless digital lithography, such as laser direct imaging (LDI) or nanoimprint lithography (NIL). The maskless digital lithography process is firstly performed to form a testing antenna grid layer and a testing antenna grid layer on two opposite surfaces of a testing substrate. Then, an offset distance between the testing antenna grid layer and the testing ground grid layer is measured to obtain the accuracy of the maskless digital lithography process. In order to obtain the conservative accuracy of such process, the aforementioned step can be repeatedly performed to obtain the poorest accuracy of such process. Then, the line width of the antenna grid layer is determined to be the first width, and the line width of the ground grid layer is determined to be the second width according to the accuracy of the maskless digital lithography process. The second width is, for example, smaller than the first width, but the present disclosure is not limited thereto, in some other embodiments, the second width may be larger than or equal to the first width.

Figure 8:
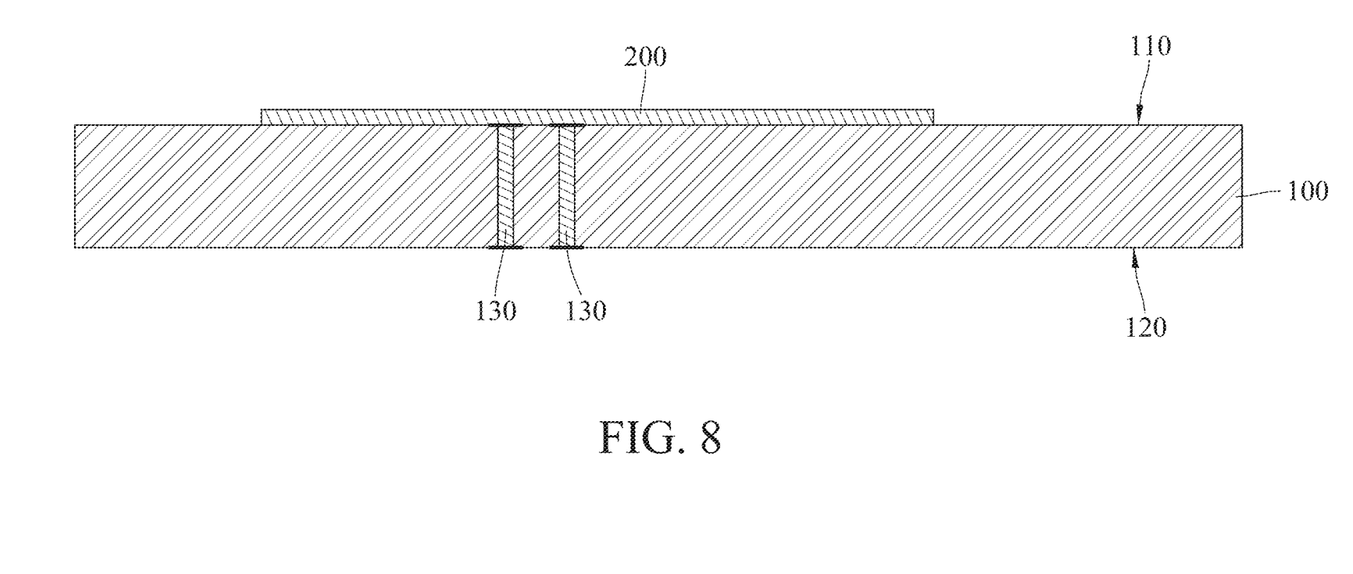
Figure 9:
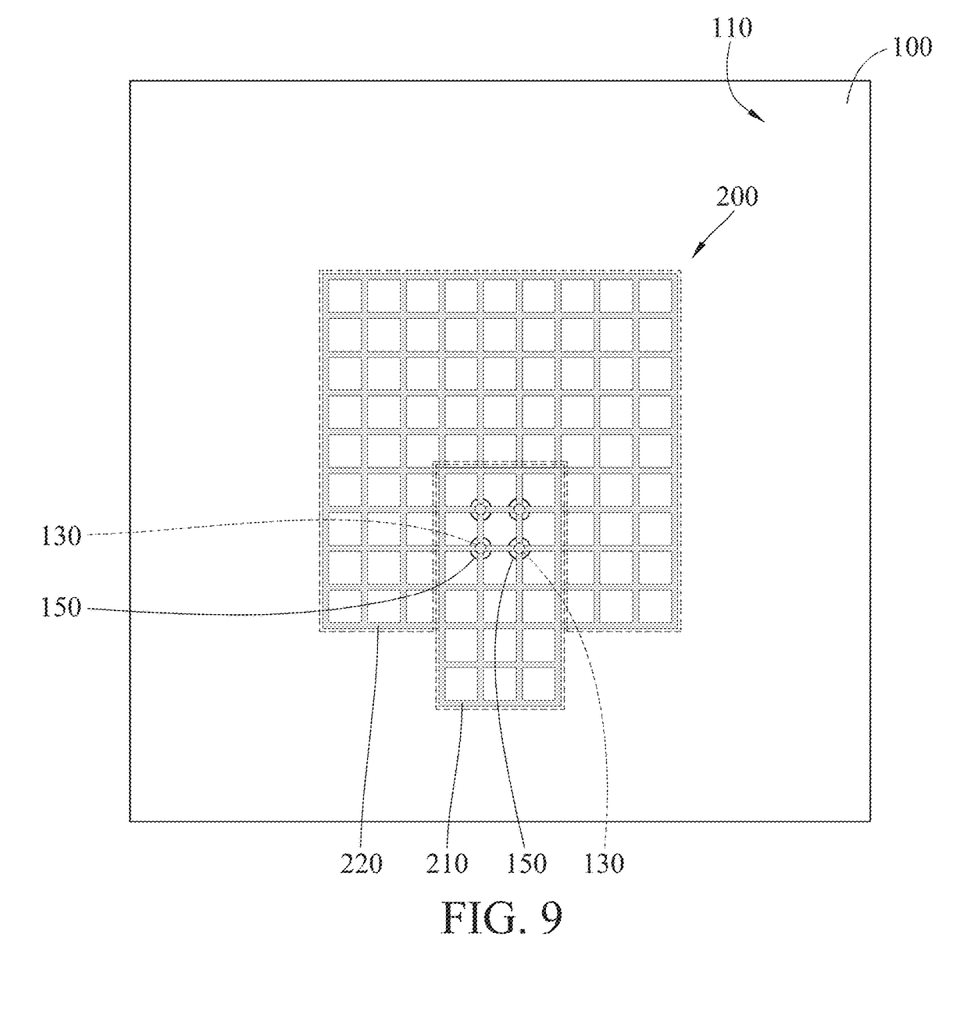

Then, as shown in FIGS. 8 and 9, the following step is to stack the antenna grid layer 200 having the line width being the first width on the first surface 110 of the substrate 100.

Figure 10:
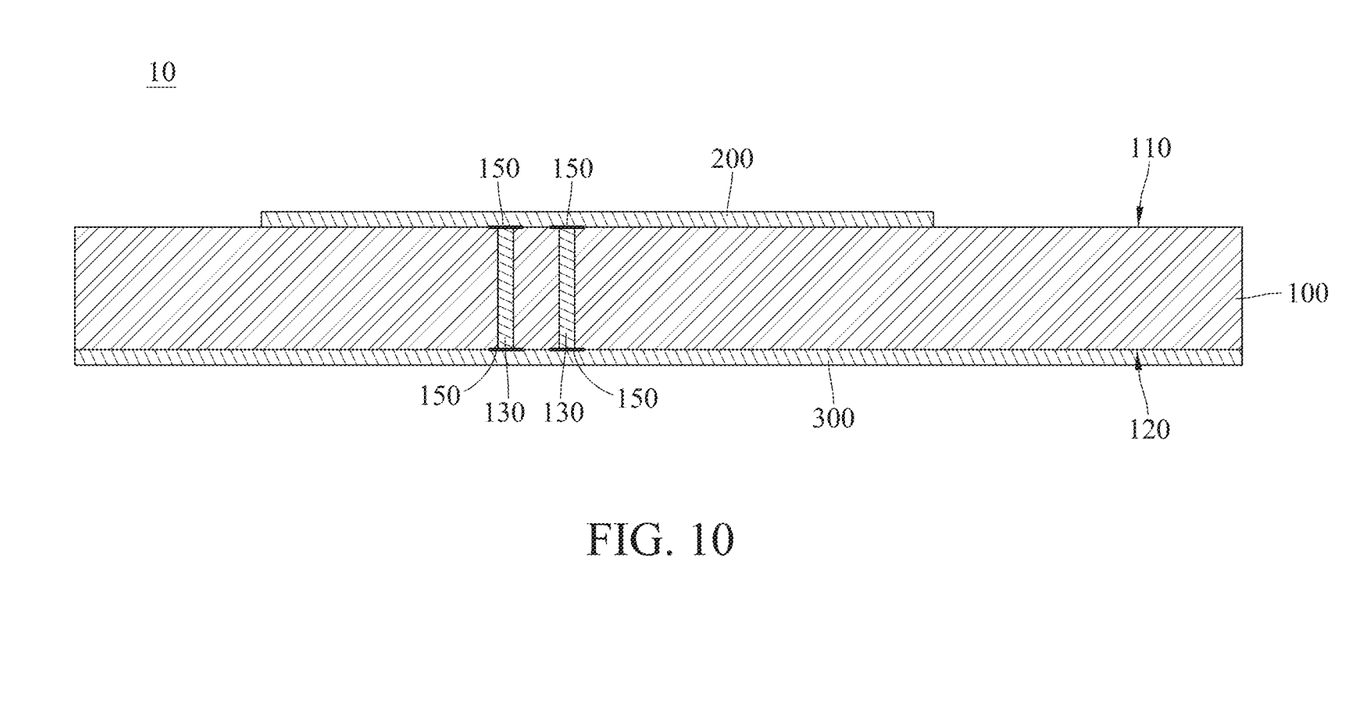
Figure 11:
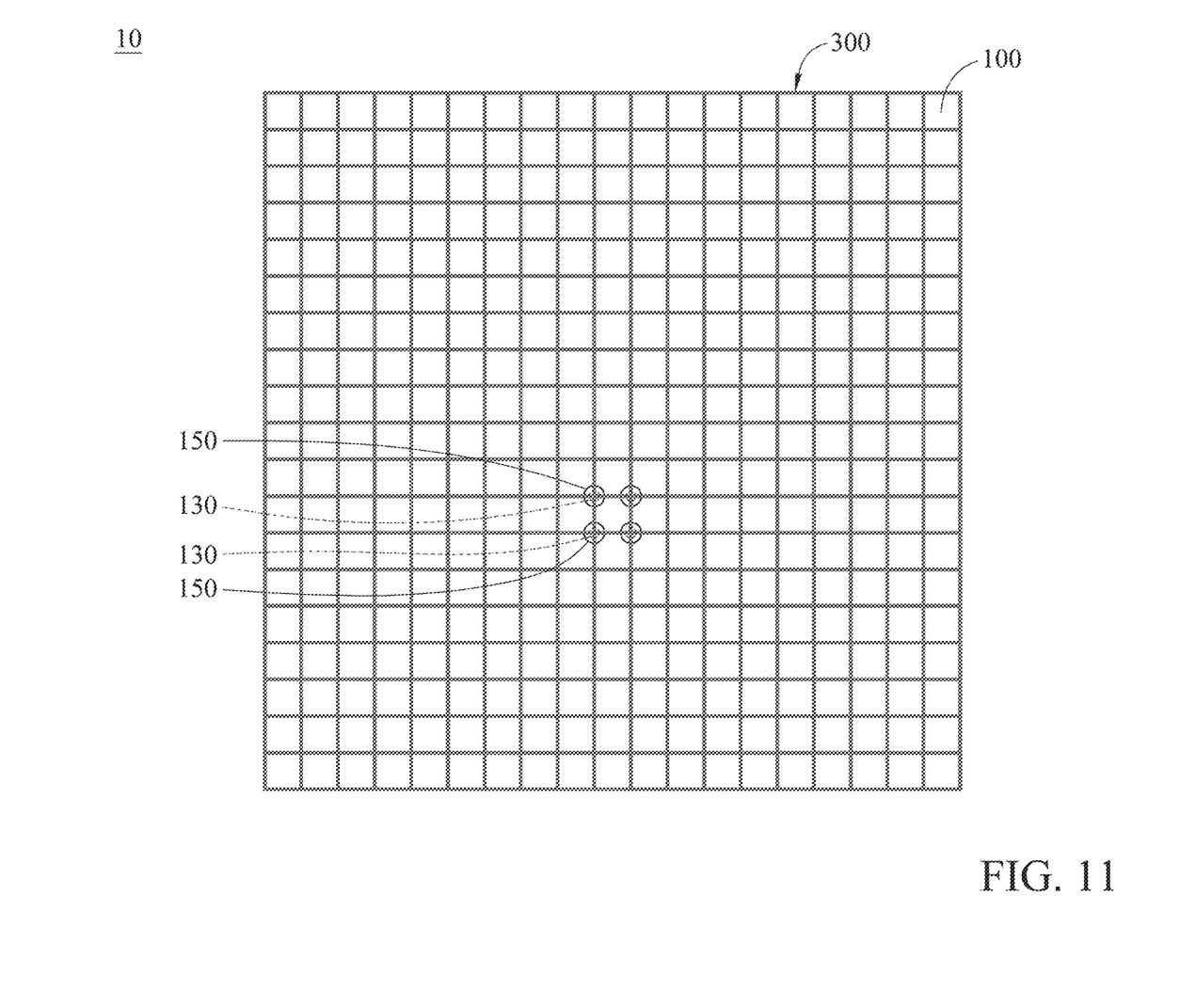

Then, as shown in FIGS. 10 and 11, the following step is to stack the ground grid layer 300 having the line width being the second width on the second surface 120 of the substrate 100, such that the ground grid layer 300 is electrically connected to the feeding portion 210 of the antenna grid layer 200 via the electrically conductive holes 130 and the electrically conductive pads 150.

According to the transparent antennas and the manufacturing method thereof, the offset distance between the projections of the gridlines of the antenna grid layer and the ground grid layer on the first surface of the substrate is smaller than or equal to a half of the difference between the line widths of the antenna grid layer and the ground grid layer, such that the overall light permeability of the antenna grid layer and the ground grid layer can be determined by the light permeability of the antenna grid layer or the ground grid layer instead of the light permeability of the antenna grid layer times the light permeability of the ground grid layer, thereby maximizing the overall light permeability of the antenna grid layer and the ground grid layer while maintaining the performance of the transparent antenna.

In addition, the electrically conductive holes with small diameters can reduce the difficulty of the through-hole forming process on the thin glass substrate while implementing the signal transmission and the requirement of the light permeability of the transparent antenna.

Moreover, the size of the ground grid layer is greater than the size of the antenna grid layer, such that the radiation efficiency of the transparent antenna can be enhanced.

On the other hand, the quantity of the electrically conductive holes may be not less than 2 and not more than 12, such that the signal transmission of the electrically conductive holes and the desired light permeability of the transparent antenna can be ensured simultaneously.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A transparent antenna, comprising:
    a substrate, having a first surface, a second surface, and at least one electrically conductive hole, wherein the second surface is opposite to the first surface, and the at least one electrically conductive hole extends from the first surface to the second surface;
    an antenna grid layer, formed on the first surface of the substrate, wherein the antenna grid layer comprises a feeding portion and a transmission portion; and a ground grid layer, formed on the second surface of the substrate, wherein the ground grid layer is coupled to the feeding portion of the antenna grid layer via the at least one electrically conductive hole;

wherein an offset distance between a projection of a gridline of the antenna grid layer on the first surface and a projection of a gridline of the ground grid layer on the first surface is smaller than or equal to half of a difference between a line width of the antenna grid layer and a line width of the ground grid layer;

wherein the at least one electrically conductive hole comprises a plurality of electrically conductive holes, the plurality of electrically conductive holes are in an array arrangement, two opposite sides of each of the plurality of electrically conductive holes are only and respectively in electrical contact with one of grid points of the feeding portion of the antenna grid layer and one of grid points of the ground grid layer.

2. The transparent antenna according to claim 1, wherein the line width of the ground grid layer is smaller than the line width of the antenna grid layer.

3. The transparent antenna according to claim 1, wherein the line width of the ground grid layer is larger than or equal to the line width of the antenna grid layer.

4. The transparent antenna according to claim 2, wherein a cell size of the antenna grid layer is equal to a cell size of the ground grid layer.

5. The transparent antenna according to claim 4, wherein the projection of the gridline of the antenna grid layer on the first surface and the projection of the gridline of the ground grid layer on the first surface entirely overlap with each other.

6. The transparent antenna according to claim 4, wherein a difference between an aperture ratio of the antenna grid layer and an aperture ratio of the ground grid layer ranges between 0% and 15%.

7. The transparent antenna according to claim 4, wherein an aperture ratio of the antenna grid layer is larger than or equal to 70%, and an aperture ratio of the ground grid layer is larger than or equal to 80%.

8. The transparent antenna according to claim 1, wherein the at least one electrically conductive hole comprises a plurality of electrically conductive holes, and the quantity of the plurality of electrically conductive holes is not less than 2 and not more than 12.

9. The transparent antenna according to claim 1, wherein the antenna grid layer and the ground grid layer are made of a metal material.

10. The transparent antenna according to claim 9, wherein the metal material is selected from a group consisting of gold, silver, copper, and iron.

11. A manufacturing method of a transparent antenna, comprising:

forming a plurality of through holes on a substrate, wherein the plurality of through holes penetrate through two opposite surfaces of the substrate;

forming a plurality of electrically conductive portions in the plurality of through holes, respectively, wherein the plurality of through holes and the plurality of electrically conductive portions together form a plurality of electrically conductive holes;

determining a line width of an antenna grid layer to be a first width and determining a line width of a ground grid layer to be a second width according to an accuracy of an alignment process that is performed to align the antenna grid layer with the ground grid layer; and forming the antenna grid layer having the line width being the first width and the ground grid layer having the line width being the second width on the two opposite surfaces of the substrate;

wherein the plurality of electrically conductive holes are in an array arrangement, two opposite sides of each of the plurality of electrically conductive holes are only and respectively in electrical contact with one of grid points of a feeding portion of the antenna grid layer and one of grid points of the ground grid layer.

12. The manufacturing method according to claim 11, wherein the step of determining the line width of the antenna grid layer to be the first width and determining the line width of the ground grid layer to be the second width according to the accuracy of the alignment process that is performed to align the antenna grid layer with the ground grid layer further comprises:

forming a testing antenna grid layer and a testing antenna grid layer on two opposite surfaces of a testing substrate via the alignment process;

measuring an offset distance between the testing antenna grid layer and the testing ground grid layer to obtain the accuracy of the alignment process; and determining the line width of the antenna grid layer to be the first width and determining the line width of the ground grid layer to be the second width according to the accuracy of the alignment process.

13. The manufacturing method according to claim 11, wherein the alignment process is maskless digital lithography.

14. The manufacturing method according to claim 13, wherein the maskless digital lithography is laser direct imaging or Nanoimprint Lithography.

15. The manufacturing method according to claim 11, wherein the second width is smaller than the first width.

16. The manufacturing method according to claim 11, wherein the second width is larger than or equal to the first width.

17. The manufacturing method according to claim 15, wherein a cell size of the antenna grid layer is equal to a cell size of the ground grid layer.

* * * * *